(12) United States Patent
Alexander et al.

(10) Patent No.: US 11,600,491 B2
(45) Date of Patent: Mar. 7, 2023

(54) LASER APPARATUS AND METHOD OF PROCESSING THIN FILMS

(71) Applicant: IPG PHOTONICS CORPORATION, Oxford, MA (US)

(72) Inventors: Limanov Alexander, Nashua, NH (US); Michael Von Dadelszen, Manchester, NH (US); Joshua Schoenly, Nashua, NH (US); Manuel Leonardo, Mountain View, CA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 283 days.

(21) Appl. No.: 16/635,097

(22) PCT Filed: Jul. 31, 2018

(86) PCT No.: PCT/US2018/044705
§ 371 (c)(1),
(2) Date: Jan. 29, 2020

(87) PCT Pub. No.: WO2019/028082
PCT Pub. Date: Feb. 7, 2019

(65) Prior Publication Data
US 2021/0098255 A1   Apr. 1, 2021

Related U.S. Application Data

(60) Provisional application No. 62/712,796, filed on Jul. 31, 2018, provisional application No. 62/549,254, (Continued)

(51) Int. Cl.
*H01L 21/02* (2006.01)
*B23K 26/0622* (2014.01)
(Continued)

(52) U.S. Cl.
CPC ...... *H01L 21/02678* (2013.01); *B23K 26/064* (2015.10); *B23K 26/066* (2015.10); (Continued)

(58) Field of Classification Search
CPC ............ B23K 2101/18; B23K 2101/40; B23K 2103/172; B23K 2103/50; B23K 2103/54; (Continued)

(56) References Cited

U.S. PATENT DOCUMENTS

2004/0228004 A1* 11/2004 Sercel ................ B23K 26/0608
359/668
2009/0231631 A1* 9/2009 Psyk .................... B23K 26/364
358/406
(Continued)

*Primary Examiner* — Sang Y Paik
(74) *Attorney, Agent, or Firm* — Yuri Kateshov, Esq.

(57) ABSTRACT

A method of fiber laser processing of thin film deposited on a substrate includes providing a laser beam from at least one fiber laser which is guided through a beam-shaping unit onto the thin film. The beam-shaping optics is configured to shape the laser beam into a line beam which irradiates a first irradiated thin film area Ab on a surface of the thin film, with the irradiated thin film area Ab being a fraction of the thin film area Af. By continuously displacing the beam shaping optics and the film relative to one another in a first direction at a distance dy between sequential irradiations, a sequence of uniform irradiated thin film areas Ab are formed on the film surface defining thus a first elongated column. Thereafter the beam shaped optics and film are displaced relative to one another at a distance dx in a second direction transverse to the first direction with the distance dx being smaller than a length of the irradiated film area Ab. With the steps performed to form respective columns, the elongated columns overlap one another covering the desired thin film area Af. The dx and dy distances are so selected that that each location of the film area Af is exposed to the shaped laser beam during a cumulative predetermined duration.

19 Claims, 5 Drawing Sheets

Related U.S. Application Data filed on Aug. 23, 2017, provisional application No. 62/539,183, filed on Jul. 31, 2017.

(51) Int. Cl.

| | | |
|---|---|---|
| *H01L 21/67* | (2006.01) | |
| *H01L 27/12* | (2006.01) | |
| *B23K 26/064* | (2014.01) | |
| *B23K 26/073* | (2006.01) | |
| *B23K 26/066* | (2014.01) | |
| *B23K 103/00* | (2006.01) | |

(52) U.S. Cl.
CPC ...... *B23K 26/0624* (2015.10); *B23K 26/0738* (2013.01); *H01L 21/02532* (2013.01); *H01L 21/02592* (2013.01); *H01L 21/67115* (2013.01); *H01L 27/1285* (2013.01); *B23K 2103/50* (2018.08)

(58) Field of Classification Search
CPC ............ B23K 26/0006; B23K 26/0622; B23K 26/0624; B23K 26/064; B23K 26/066; B23K 26/0738; B23K 26/082; B23K 26/352; C23C 14/58; C23C 16/56; H01S 3/10
USPC .......................... 264/400; 219/121.6–121.83
See application file for complete search history.

(56) References Cited

U.S. PATENT DOCUMENTS

| | | | |
|---|---|---|---|
| 2015/0177525 A1* | 6/2015 | Shudo ................ | G02B 27/0927 359/639 |
| 2016/0013057 A1* | 1/2016 | Avdokhin ......... | H01S 3/094003 372/6 |

* cited by examiner

LASER APPARATUS AND METHOD OF PROCESSING THIN FILMS

BACKGROUND OF THE DISCLOSURE

Field of the Disclosure

This disclosure relates to a laser method of two-dimensional (2D) processing of a thin film deposited on a glass panel sized to be orders of magnitude larger than a laser beam. The disclosure is further related to a fiber laser which in combination with a homogenizer implements the disclosed process.

Prior Art

One of the currently popular methods for producing glass panel displays utilizes an excimer laser low-temperature polycrystalline silicon (LTPS) annealing process that is well known to one of ordinary skill in the display arts. In production of LTPS systems, the rectangular output of the pulsed excimer laser is significantly reshaped into a long, thin line beam typically having a length equal to the width, or half the width, of the panel. Excimer lasers used for excimer laser annealing (ELA) processes have a high energy per pulse with a low repetition rate. This makes them suitable for single line annealing of large panels, wherein the line beam encompasses the entire panel width or at least half the width. This enables the entire panel to be processed in one or two passes under the laser.

However, with KHz frequencies leading to high energies, excimer lasers, which by themselves are very expensive and cumbersome, require multiple gas changes over approximately 48 hours day-long period of operation, which also makes them expensive to operate. This and other necessary attributes of excimer lasers render them rather inefficient and make the overall cost of owning and operating excimer sources very high.

The above disadvantages of excimer lasers led up to a widespread use of fiber lasers operating in continuous wave (CW), quasi CW (QCW) burst mode regimes, with the latter characterized by two different repetition rates for bursts (characterized by a burst repetition rate (BRR) or a burst repetition frequency (BRF))—which are relatively long pulses—and for pulses (carrier pulse repetition rate (PRR)) within each burst. As is well known, fiber lasers are highly efficient, substantially maintenance-free and low cost rugged light sources.

The fiber lasers used in the LTPS systems are disclosed, for example, in PCT/US 2017/012716 (PCT '716) disclosing QCW, pulsed and even CW fiber lasers for spot beam crystallization of a-Si films. The disclosed system in PCT'716 is applicable to small-size panels that can be fully covered in one direction by a laser beam scanned across the entire film. In particular, a molten zone created on the film is translated in the scanning direction progressively heating each subsequent region across the entire width of the substrate.

QCW fiber lasers in general, including burst mode fiber lasers with configured to output a total power output that is equivalent to an excimer laser source, however, have orders of magnitude lower pulse energies and requisite orders of magnitude higher repetition rates. The pulse energy is too low to allow for a line beam from a single fiber laser to encompass the entire panel if its width is greater than the length of the line beam.

For this reason, it is necessary to stitch together partial line beams in the line beam's long axis/scanning direction, as disclosed in PCT/US16/40222, such that the resultant poly-Si grain structure is continuous over the region of interest greater than the beam's length. The latter may be the entire panel area, or portions thereof.

Stitching together two adjacent lines in the long beam axis provides significant challenges not encountered by PCT '716, but acknowledged in U.S. Ser. No. 14/790,170 (US '170), which is fully incorporated herein by reference. Ideally, each line beam will have a perfectly sharp edge and the edges of adjacent beams will exactly abut. This is not physically realizable due to diffraction limited point spread function sharpness of the line beam edge and limitations in mechanical accuracy. For instance, the ends of the line beams will always have some softness of definition. There are a few possibilities of stitching, but regardless of however the beams are stitched, it is very likely that there will be some artifacts at the seams between adjacent beams that will result in some discontinuity of p-Si grain structure and eventually in poor quality of the annealed panel.

Furthermore, beam stitching is accompanied by the formation of Mura, a phenomenon observed on laser treated substrates that is characterized by low contrast and non-uniform brightness. and can give a "rippled" appearance to the laser treated substrates. The Mura is unacceptable and considered a defect since the quality of the p-Si substrates is poor.

A need therefore exists for a method of processing large thin film areas on a substrate panel using a fiber laser line beam, which is much smaller than the thin film area Af, such that no stitching of adjacent beams is needed.

Another need exists for a fiber laser, which is configured with a homogenizer, implementing the disclosed method.

SUMMARY OF THE DISCLOSURE

The inventive method, meeting the above disclosed needs, is applied to a variety of applications including, without any limitation, Fiber Laser Annealing (FLA) amorphous Si annealing, Sequential Lateral Solidification (SLS) amorphous Si annealing, Doping Impurity Activation, Silicon Carbide (SiC) annealing (e.g., ohmic contacts), and polyimide Laser Lift Off (LLO) applications. The disclosed method eliminates stitching by providing the overlap between adjacent irradiated thin film areas, further referred to as columns, in the second direction X, whereas each column is formed by irradiating film areas in the first direction Y. By controllably varying a distance dx between the columns and a distance dy between the adjacent irradiated areas within each column, the desired cumulative exposure duration od/number of pulses per each irradiated location of the film area Af and temperature are achieved. Hence the disclosed method is further referred to as the 2D process.

In particular, the disclosed 2D method of fiber processing a thin film is implemented by using a QCW fiber laser that operates in the burst regime, outputting a laser beam at a high repetition carrier pulse rate (PRR) which is preferably higher than 100 KHz and can be as as high as 1 GHz. The laser beam propagates along a path through an optical beam shaping unit. The shaped beam—a line beam—is then incident on the film, thereby forming a first irradiated thin film area Ab on the film's surface.

Thereafter, the shaped laser beam and the substrate are displaced, preferably continuously, relative to one another in a first direction Y at a distance dy, which is smaller, greater than, or equal to a width of the irradiated thin film area Ab. Accordingly, the adjacent irradiated areas Ab may overlap one another, be adjacent to, or spaced apart from one another in the first direction Y. As result, an elongated column formed on the film is defined by a sequence of uniformly irradiated thin film areas Ab.

The completion of the column, which has a width corresponding to the length of the line beam, is followed by displacing the thin film and the beam shaping unit in the second, scanning direction X at a distance dx. The distance dx is selected to be shorter than the width of the previously formed column. Hence the columns are overlapped in the second direction which eliminates the need for subsequent stitching of the adjacent columns.

The process continues until the desired part of the film area Af or the entire film area Af is processed. The processed film thus has each location thereof exposed to the shaped laser beam for the predetermined cumulative duration/number of bursts, and the irradiated area Af of the thin film is characterized by a uniform fluence. As a consequence, the irradiated film area Af has the desired microstructure or other properties, e.g., surface sheet resistance, or contact resistance.

The disclosed fiber laser system implementing the method is configured with a multi-axis stage supporting the thin film area Af to be irradiated. At least one fiber laser source outputs a laser beam processed in an optical beam shaping unit. The latter is configured to shape the laser beam into a line beam which has desired geometrical dimensions, intensity profile, and an optimal power to form a first irradiated thin film area Ab which is a fraction of the total thin film area Af. Processing the thin film area Af in accordance with the inventive 2D method is controlled by a processor such that adjacent columns overlap one another in the second x direction and individual irradiated film areas Ab of each column overlap one another in the first y direction. The dx and dy distances are so selected that each location of the processed total or part of film area Af is exposed to the shaped beam a predetermined number of times, i.e., irradiated during the desired exposure duration, and has a predetermined temperature.

The inventive fiber laser system may be structured using a burst mode QCW fiber laser in combination with a homogenizer such as imaging or non-imaging fly's eye, bi-prisms, or any other known configurations associated with segmenting the laser beam. In accordance with a salient feature of this embodiment, a plurality of delay glass pairs are incorporated in the homogenizer and configured to correct manufacturing tolerances of the homogenizer's components. In particular, each delay glass pair includes two lenses rotatable and linearly displaceable relative to one another in orthogonal planes so as to focus multiple beamlets in a common focal plane on the surface of the film thus shaping the laser beam into a narrow line beam which has a width ranging between 3 and 50 μm and a length between 1 and 10 cm.

Numerous features of the disclosed system and method can be used interchangeably as will become more apparent from dependent claims reciting respective features.

BRIEF DESCRIPTION OF THE DRAWINGS

The above and other aspects and features, which can be used partially or in any combination in the inventive method and apparatus, will become more readily apparent from the following drawings, in which.

SPECIFIC DESCRIPTION

Figure 1:
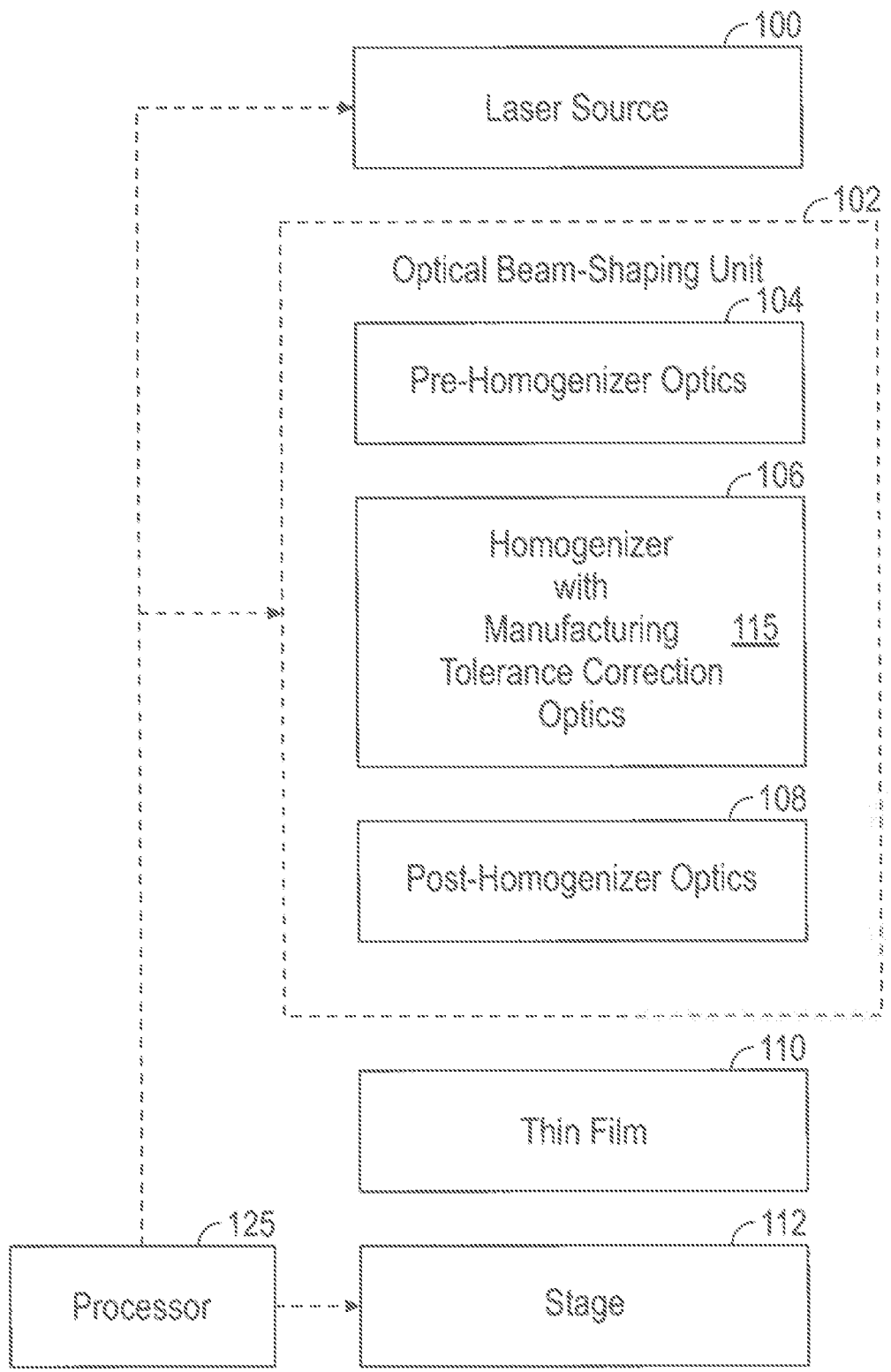
FIG. 1 is a flow chart representing the inventive method.

Reference will now be made in detail to the disclosed system. Wherever possible, same or similar reference numerals are used in the drawings and the description to refer to the same or like parts or steps. The drawings are in simplified form being far from precise scale. For purposes of convenience and clarity only, the terms "connect," "couple," and similar terms with their inflectional morphemes do not necessarily denote direct and immediate connections, but also include connections through mediate elements or devices.

The disclosed method utilizes a CW or QCW burst laser beam for processing thin films. The disclosed method is specifically tailored to process a thin film area Af which is orders of magnitude larger than an individual or partial film area Ab irradiated by the line beam. In contrast to known conventional techniques, no stitching of successive partial irradiated film areas Ab in first y and second x orthogonal directions is needed. The methodology described in the disclosure can be used for applications including, but not limited to: FLA (ELA equivalent) amorphous Si annealing, SLS amorphous Si annealing, SiC annealing (e.g. ohmic contacts), and Polyimide LLO applications.

FIGS. 1 and 2 exemplify the inventive system incorporating a QCW fiber laser source 100 which outputs nanosecond (ns) bursts with burst duration varying between 50 and 500 ns. The burst regime is characterized by long pulses or bursts output at a burst repetition rate (BRR); each burst is partitioned into short pulses output at a carrier pulse repetition rate (PRR) in a 100 MHz to 1 GHz range which is, of course, higher than the BRR.

As typical for fiber lasers utilized in thin film processing, fiber laser source 100 includes one or more Yb QCW lasers each operating in a 1 micron range and outputting generally spatially and temporally coherent light which is necessary for effective generation of the second or third harmonic at respective 5xx nm and 3xx nm, such as 532 nm and 355 nm respectively, in a manner well known to the artisan. The coherence—so attractive a feature of the fiber laser—however, should be mitigated in order to obtain a fixed homogeneous line beam with a high aspect ratio.

The shaping of the laser beam takes place in an optical beam-shaping unit 102 that may include a pre-homogenizer optics 104, such as a power attenuator, collimator and in some instances—polarization controller. The heart of beam shaping unit 102 is a homogenizer 106 which is discussed in sufficient detail below. Meanwhile, the shaped laser beam is further guided by post-homogenizer optics 108, as will be discussed below.

As well understood by one of ordinary skill, homogenizer 106 may also function as a beam combiner for multiple fiber laser sources 100. Alternatively, multiple laser sources 100 are associated with respective optical schemes similar to the shown example, which deliver multiple line beams to the thin film surface.

The thin film 110 is supported on a stage 112 which can be displaced in first y and second x directions relative to laser source 100 and beam shaping unit 102. The relative displacement implies that either one of these components is movable while the other is stationary, or both components move relative to one another. Preferably, stage 112 is a multi-axis component operative to move in first (y) and second (x) directions. A single burst of individual homogenized beam irradiating thin film area Ab has the desired spatial intensity profiles in the first direction or second direction or first and second directions. Any of Gaussian, super Gaussian, or flat top profiles is applicable for the intended purposes.

Figures 2A, 2B:
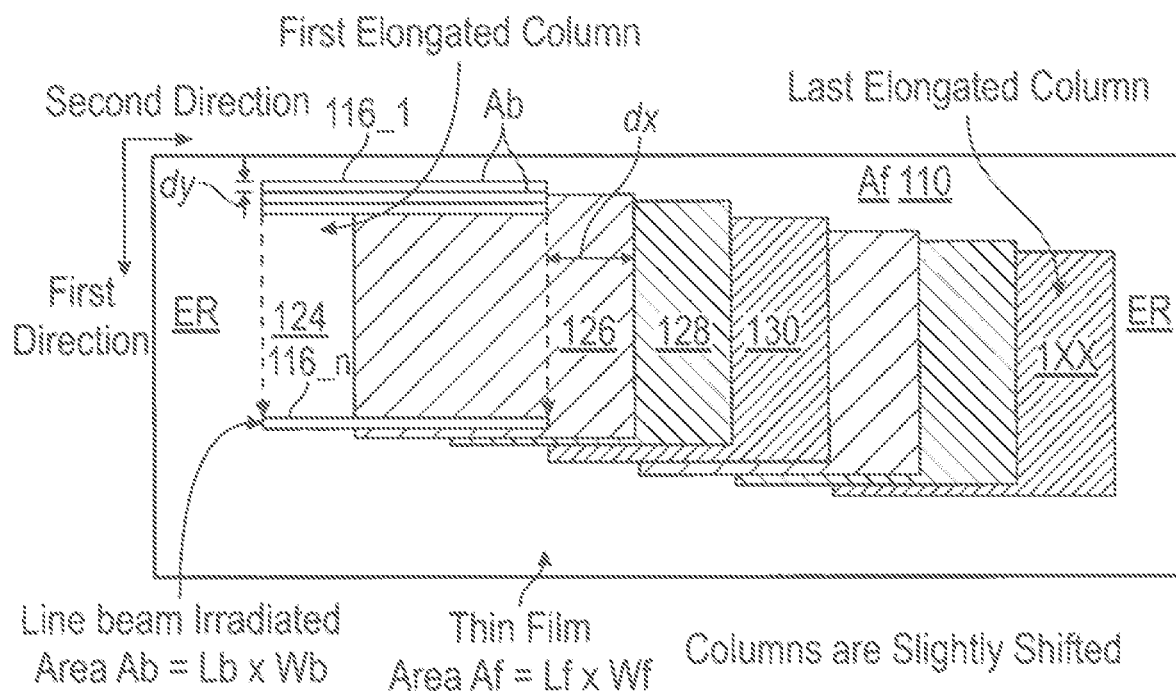
FIGS. 2A-2B are a schematic representations of a thin film area Af processed in accordance with the invention.

FIGS. 2A-2B illustrate the operational principle of the above discussed system. In particular, the following description relates to a 2D process in which film 110 is irradiated in the first Y and second X directions. It should be remembered that this invention discloses the fiber-based laser method of processing large area thin films is implemented with a small fiber laser beam. As a result, the partial film area Ab irradiated by the homogenized line beam is orders of magnitude smaller than the desired film area Af to be irradiated. The FLA process requires anywhere from 2 to 50 exposures per location, with a 10-30 exposures per location being typical for obtain a substantially uniformly dimensioned grains. The prior art dealt with these problems by continuously stitching consecutive irradiated film areas Ab in both SLS and FLA annealing. Unfortunately, the results hardly met the requirements for the quality of the processed film area Af. Particularly troubling results were received in the second/scan direction X. The inventive method, however, allows for the overlap in both directions. The step size or distance dx in the second direction X is small to preclude the MURA phenomenon.

Referring to FIG. 2A, partial thin film area Ab 114 irradiated by the homogenized line beam may have a width Wb anywhere between 3 and 50 µm and a length Lb 500-1000 and even more times greater than the width Wb. Turning to FIG. 2B, upon irradiating first partial thin film area Ab $116_{-1}$, stage 112 and beam-shaping unit 102 of FIG. 1 are sequentially displaced relative to one another at a distance dy to form a first column 124 in the first direction Y with area Ab $116n$ being the bottom irradiated area of first column 124. The distance dy may vary and is is selected to prevent a thermal positive feedback between sequential irradiations above a predetermined threshold. The thermal positive feedback indicates that the temperature of a location within the overlapped film area is prohibitively high which indicates that a burst energy threshold was exceeded.

The minimal possible distance dy may be determined in the following manner. Assume that we form a first film area Ab, which is irradiated by an individual burst with a first burst energy $Ebo=P_{laser\ source}/BRR$. After analyzing the microstructure of the irradiated area Ab, one of ordinary skill can determine whether this area was heated too much, too low, or good. Assuming the latter and knowing the burst energy Ebo, the following area Ab is formed at a distance dy1 greater than the width Wb (FIG. 2B) of the area Ab. In other words, two adjacent areas Ab are spaced from one another, and the thermal conditions of respective first and second areas Ab are independent from one another. Having analyzed the second area Ab to ensure that the burst energy Ebo is indeed optimal or maximal, the operator selects a distance dy2 such that consecutively formed areas Ab overlap one another. If the overlapped area still has the desired microstructure, the distance dy is again reduced and a further burst forms a further area Ab overlapping a larger area of the first film area Ab. With a progressively smaller distance dy, the film within the overlapped area heats more and more. As a consequence, the burst energy Eb becomes progressively lower than the optimal burst energy Ebo. Once the burst energy Ebo is reduced to about 50% Ebo, which is the lowest possible energy sufficient to provide an acceptable quality of the FLA, the corresponding distance dy is considered to be smallest possible distance in the first direction Y and any further reduction of this distance can only lead to a prohibitively overheated overlapped film area. Thus, the drop of the optimal burst energy to 50% Ebo indicates the smallest possible dy distance and is further referred to as a step threshold. Ultimately, of course, this threshold may be 90%, 80%, 70% and 60% since it depends entirely on the conclusion drawn by the experienced practitioner.

As shown in FIG. 2B, this distance dy is less than the width Wb of the area Ab which provides the overlap between successive partial areas Ab of each of the formed columns. But this distance may also be equal to the width Wb. Furthermore, if the distance dy is selected to be greater than the width Wb, the adjacent areas Ab are spaced apart in the first direction Y. In this case, an intermediate un-irradiated area is formed between adjacent irradiated areas. The intermediate un-irradiated areas can be irradiated via a subsequent scan with the laser line beam provided the selected distance y does not correspond to the threshold.

After first column 124 is fully formed, stage 112 and beam shaping unit are displaced in the second direction X at a distance dx. Since the distance dx is shorter than the length of partial area Ab, corresponding partial areas Ab of respective adjacent columns overlap in the second direction X, as better shown in FIG. 2A. After the first area Ab of a second column 126 is formed, stage 112 and beam shaping unit 102 are displaced relative one another in first direction Y to form subsequent partial areas Ab which define the second column 126. In use, the relative displacement in the first direction Y which is usually realized by stage 112, is continuous and does not exceed a few hundred millimeters per second. Such a velocity affects the alignment of partial areas Ab of respective columns 124, 126, 128 and 130 in the second direction X very little and can be easily tolerated. The process continues with a further formation of the desired number of columns 1XX. Whether the desired thin film area Af corresponds to the total area of film 110 or a panel supporting this film, or just a segment of the total area, the above disclosed process remains unchanged. To fully process the entire film area, the edges of the film spaced in the second direction X receive only a portion of the homogenized line beam. Typically, the edge areas ER have a width in the second direction X not exceeding the dx distance. Otherwise, the end regions of film 110 are not sufficiently heated and cooled to provide the desired film microstructure of these regions. All of the above operations are controlled by a processor 125.

Figure 3:
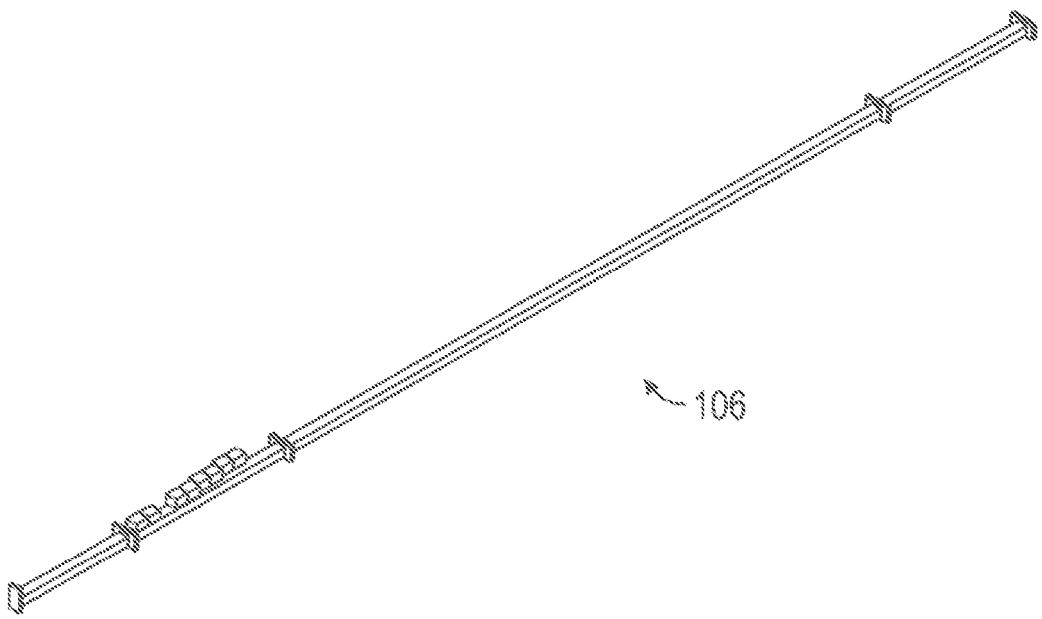
FIG. 3 is a multi-beamlet imaging fly's eye homogenizer and cross-axis objective lens.

FIG. 3 illustrates homogenizer 106. Many beam homogenizers work on the same principle: the beam is divided into beamlets that are then superimposed on top of one another. Thus any of bi-prism, off-axis cylinder lens and other known configurations can in principle be incorporated in the disclosed system. The best experimental results have been obtained with imaging and nonimaging fly's eye homogenizers, with the imaging fly's eye configuration shown in FIGS. 3-5.

Figure 4:
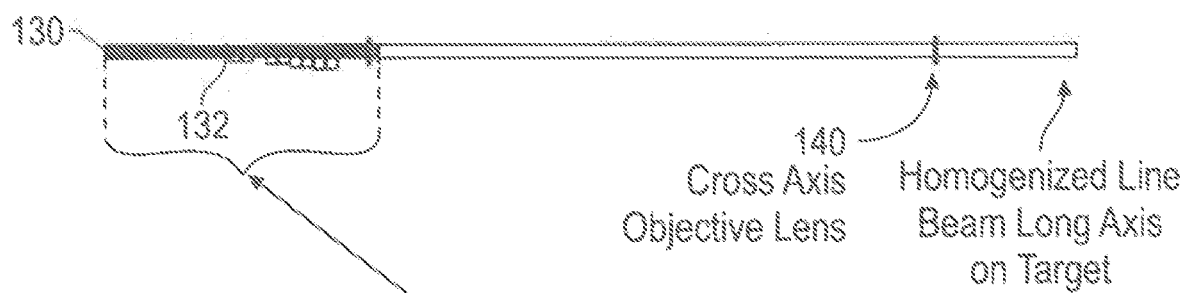
FIGS. 4 and 5 illustrate respective views of the homogenizer.
Figure 5:
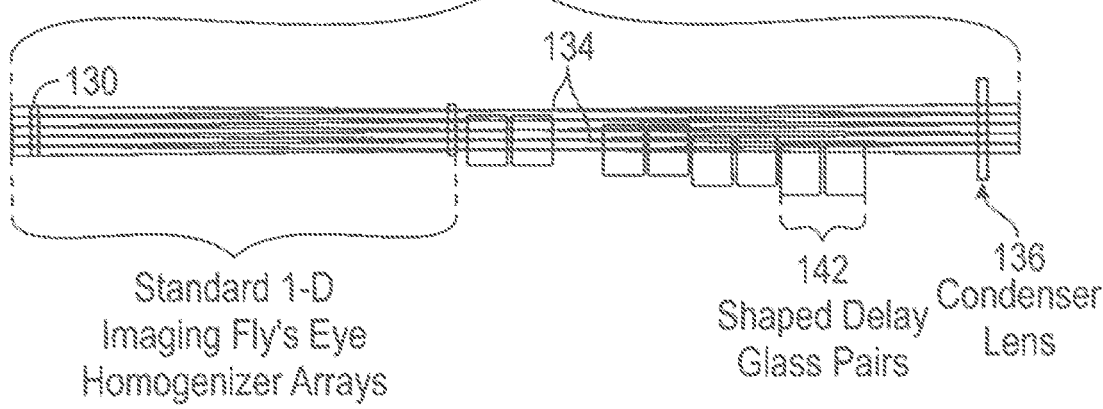

Referring to FIGS. 4 and 5, imaging fly's eye homogenizer 106 is configured with two spaced apart arrays of lenslets 130, 132 dividing, as known to the artisan, the laser beam into a plurality of beamlets 134. The beamlets are stretched in the second direction X and are merged on the surface of thin film 110 by condenser lens 136. However the beamlets may be somewhat offset in the first direction Y. To prevent the latter, the beamlets are guided through a cylindrical objective unit 140 focusing each stretched beamlet on the surface of film 110. As a result, the offset among the beamlets in the first direction is minimized. Furthermore, the objective unit 140 may comprise at least one acylindrical surface designed to provide a desired intensity profile in the narrow axis (Gaussian, super Gaussian, top hat.)

The relative position of condenser lens 136 and objective unit 140 is not fixed relative to one another. Thus although condenser lens 136 is shown before lens 140 in FIG. 4, the reverse position of these lenses is acceptable. Within the context of this disclosure, either one or both lenses 136 and 140 are considered to be part of post homogenizer optics 108 in FIG. 1.

Additionally, homogenizer 106 is configured with multiple delay glass pairs 142 located downstream from lenslets array 132. As known, delay glass pairs retard the stretched beamlets relative to one to even further mitigate any remaining coherence and constitute correction optics 115 of FIG. 1.

According to another salient feature of the invention, sequential delay glass shaped pairs 142 allow for the simultaneous mitigation of coherence effects and lenslet manufacturing tolerances, as explained below.

Figure 6A:
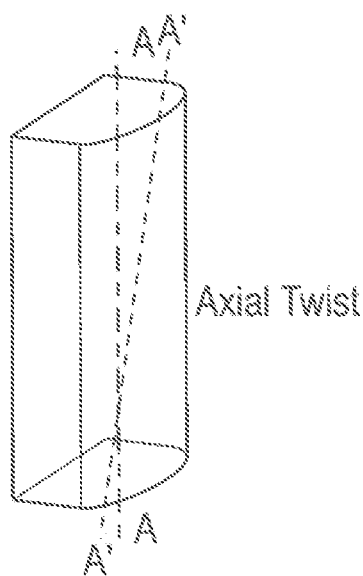
FIGS. 6A, 6B, 7A, 7B, 8A and 8B illustrate possible manufacturing defects of optical components.
Figure 7A:
Figure 8A:
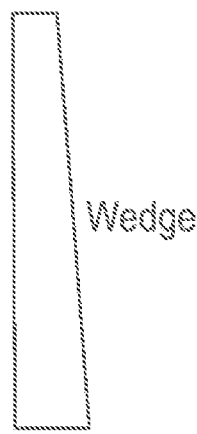
Figure 6B:
Figure 7B:
Figure 8B:
Figure 9A:
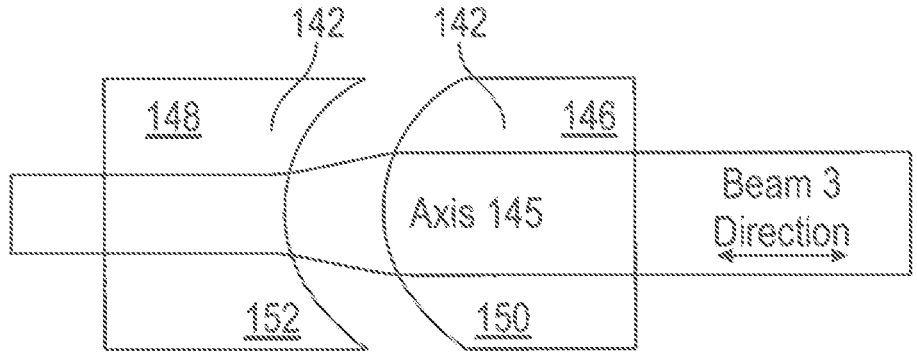
FIGS. 9A and 9B illustrate respective side and isometric views of the inventive delay glass pair.
Figure 9B:
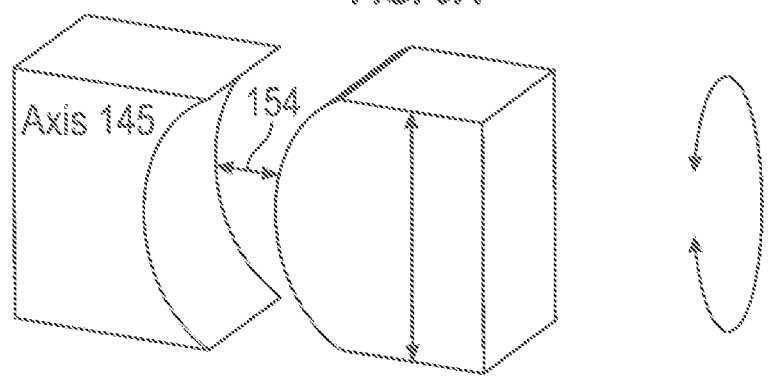
Figure 10A:
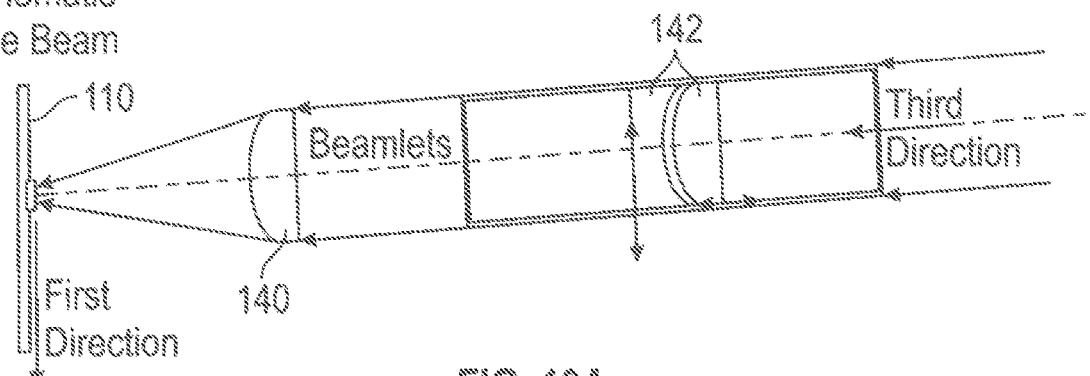
FIGS. 10 and 10B are respective side and top views of the optical schematic of the homogenizer.
Figure 10B:
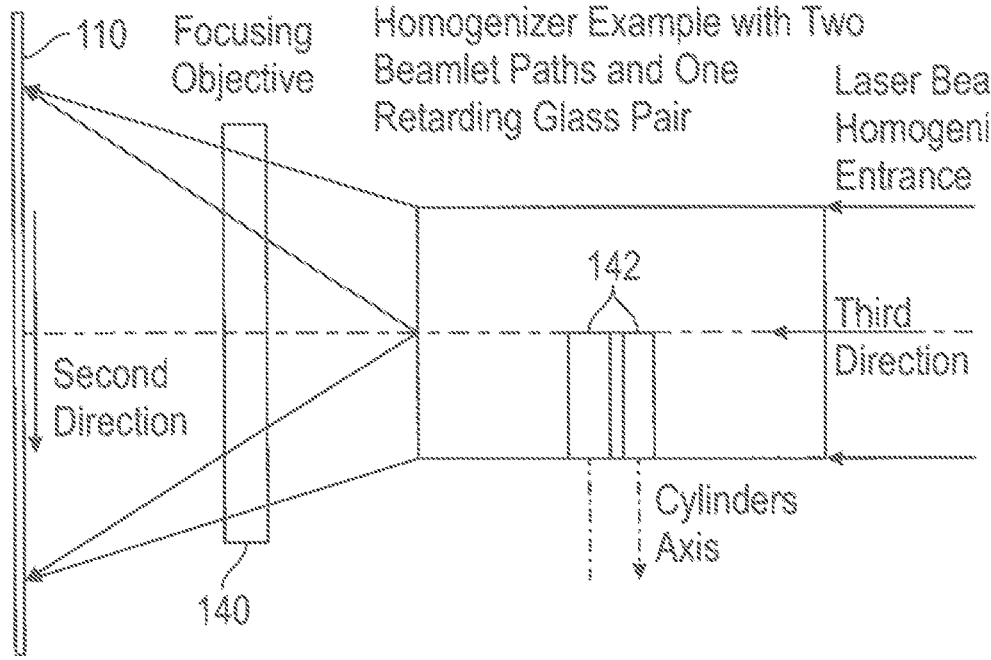

FIGS. 6A, 7A and 8A illustrate different manufacturing defects created during the production of lenslets and in principle other homogenizer components, such as delay glasses. FIGS. 6A and 7A illustrate axial twist which occurs when instead of ideal axis of symmetry A-A, the cylindrical lens is manufactured with skewed axis A'-A'. The axial twist rotates the line beamlets as shown in FIG. 6B. The lenses may be manufactured with a wedge—center thickness variation as shown in FIG. 8A. This defect shifts the line beam resulting in individual line beamlets being offset from each other, as shown in FIG. 7B. The presence of both axial twist and wedge defects results in simultaneous rotation and twist of beamlets relative one another on the surface of the thin film, as shown in FIG. 8B. All of these manufacturing defects can be corrected using individual delay glass pairs 142 configured in accordance with the invention.

Referring to FIGS. 9A and 9B and 10A-10B, as known, delay glass pair 142 includes positive and negative lenses 146, 148 provided with respective convex and concave faces 150, 152 which define therebetween a gap 154, with concave face 150 being somewhat smaller than that of convex face 152. Displacing lenses 146 and 148 toward and away from one another along common longitudinal axis 145 (FIG. 9A) ensures infinite conjugate with the gap 154. In other words, this linear displacement in along a beamlet path in a third direction (FIGS. 9A, 10A and B) helps focus the beamlets in a common focal plane on the surface of the film. The lenses 146 and 148 are also displaceable relative to one another in a in a direction perpendicular to both third and second directions. This displacement adjusts relative centration compensation for wedge tolerances. Finally, both lenses are configured to rotate relative to one another which compensates for axial twist tolerance (beam rotation). Adjusting centration and rotation simultaneously compensates for wedge and axial twist tolerances.

Delay glass pairs are installed and aligned sequentially, such that one beamlet of a pair of neighboring beamlets sees an increased total glass thickness (increased delay) and the beamlets are sequentially compensated for centration and axial twist. In other words, beginning with a lenslet located next to the side lenslet in each array, the number of delay glass pairs increases, as shown in FIGS. 3-5. Delay glass pairs may be installed with alternating concave/convex ordering to minimize changes in cross axis beamlet height. The combined function of the delay glass pairs allows for maximum use of the limited distance over which the individual beamlets remain separated.

Those skilled in the art will recognize that the foregoing embodiments are presented by way of example only and that within the scope of the appended claims and equivalents thereto; the invention may be practiced otherwise than as specifically described. The present disclosure is directed to each individual feature, system, material and/or method described herein. In addition, any combination of two or more such features, systems, materials and/or methods, if such features, systems, materials and/or methods are not mutually inconsistent, is included within the scope of the present invention.

The invention claimed is:

1. A method of fiber laser processing of thin film deposited on a substrate, wherein a thin film area Af is defined by a width Wf and length Lf, comprising:
   (a) providing a laser beam from at least one quasi-continuous fiber (QCW) fiber laser operating in a burst regime;
   (b) directing the laser beam through a beam-shaping unit onto the thin film, thereby shaping the laser beam into a homogeneous line beam which irradiates a first thin film area Ab on a surface of the thin film, with the irradiated thin film area Ab corresponding to an individual burst, and being a fraction of the thin film area Af, wherein the film area Ab is defined by a length Lb and width Wb;
   (c) continuously displacing the beam shaping unit and the film relative to one another in a first direction at a distance dy, wherein the dy distance is selected to prevent a thermal positive feedback between sequential irradiations above a predetermined dy threshold, thereby forming a sequence of uniform thin film areas Ab which along with the first thin film area Ab together define a first elongated column so that sequential areas Ab are either adjacent to one another or overlapped; and
   (d) thereafter displacing the beam shaped optics and substrate with the film thereon relative to one another at a distance dx in a second direction transverse to the first direction and repeating steps (b)-(c), the distance dx being smaller than a length of the irradiated film area Ab, thereby forming a plurality of overlapped elongated columns on the thin film area Af, the dx and dy distances being so selected that that each location of the film area Af is exposed to the predetermined number of bursts ranging from 3 to 50.

2. The method of claim 1, wherein directing the laser beam through the beam shaping unit includes:
   guiding the laser beam through an array of lenslets, thereby splitting the laser beam into a plurality of beamlets propagating in a third direction which is skewed to the first direction Y and orthogonal to the second direction,
   temporarily retarding the beamlets by guiding them through respective delay glass pairs, wherein the delay glass pairs each are configured with spaced positive and negative cylinder lenses which have substantially equal focal lengths and a common longitudinal axis extending in the third direction, the glass delay pairs each being provided with respective curved faces opposing one another so as to define an axial gap therebetween.

3. The method of claim 2, wherein the temporarily retarding mitigates coherence effects and manufacturing tolerances of the homogenizer to form the homogeneous line beam with a beam width equal to the Wb, ranging between 3 and 50 µm, and aspect ratio of 1 to at least 500, the temporarily retarding including:
(a) axially displacing the spaced lenses of each pair towards and away from one another along the third direction, thereby focusing the beamlets in a common focal plane on the surface of the thin film,
(b) rotating the spaced lenses of each delay glass pair relative to one another about the common longitudinal axis which extends in the third direction,
(c) displacing the spaced lenses relative to one another perpendicular to the common longitudinal axis and the second direction X, or
(d) a combination of the (a) through (c).

4. The method of claim 2 further comprising placing increasing number of delay glass pairs downstream from the cylindrical unit beginning with a lenslet next to a side lenslet of the array and sequentially manipulating each of the glass pairs to form the line beam.

5. The method of claim 1, wherein the QCW fiber laser operatese with a duty cycle less than 100% so as to output the laser beam at a pulse repetition rate of at most 1 Ghz, which is higher than a burst repetition rate and sufficient to generate a thermal response of the thin film identical to that caused by the laser beam from the QCW fiber laser operating at 100% duty cycle.

6. The method of claim 1 further comprising generating and directing at least one additional laser beam on the thin film so as to have desired spatial intensity profiles in the first direction or second direction or first and second directions.

7. The method of claim 1 further comprising controlling polarization of the laser beam.

8. A fiber laser system for processing a thin film deposited on a substrate comprising:
a stage supporting the substrate;
at least one QCW fiber laser source outputting bursts of a laser beam along a light path;
an optical beam shaping unit configured to shape the laser beam into a homogeneous line beam which is incident onto a surface of the thin film with desired geometrical dimensions, intensity profile, and am optimal power to form a first irradiated thin film area Ab which corresponds to a single burst and constitutes a fraction of a total thin film area Af to be processed, the film area Ab being defined by a length Lb and width Wb; and
a processor configured to execute a series of steps comprising;
displacing the stage and optical beam shaping unit relative one another in the first direction at a distance dy so as to form a sequence of irradiated thin film areas Ab which cumulatively define a first elongated column of predetermined length and width, the distance dy being selected to be smaller than or equal to a width of the irradiated thin film area Ab to prevent a thermal positive feedback above a predetermined thermal threshold between sequential bursts,
displacing the stage and optical beam shaping unit relative to one another in a second direction X orthogonal to the first direction Y at a distance dx,
displacing the stage and optical beam shaping unit in the first direction to form a second column defined by the sequence of irridated thin film areas Ab and overlapping the first column, and
repeatedly and sequentialby displacing the stage and optical beam shaping unit in the first and second directions at respective distances dy and dx to form a plurality of overlapped columns on the thin film area Af until the total thin film area Af processed, the dx and dy distances being so selected that that each location of the film area Af is exposed to the predetermined number of bursts ranging from 3 to 50.

9. The fiber laser system of claim 8, wherein the optical beam-shaping unit includes a homogenizer operative to mitigate coherence of the laser beam, the homogenizer including one or more arrays of lenslets segmenting the laser beam into multiple beamlets which propagate in a third direction skewed to the first direction and orthogonal to the second direction.

10. The fiber laser system of claim 9 further comprising one or more arrays of of delay glass pairs located in respective paths of beamlets and configured to compensate the homogenizer manufacturing tolerances, each delay glass pair having a common elongated axis which extends in the thud direction, and being configured with two axially spaced positive and negative cylinder lenses which are provided with respective convex and concave surfaces defining an axial gap therebetween.

11. The fiber laser of claim 10, wherein the positive and negative cylinder lenses of each pair are displaceable relative to one another, wherein the displacement of positive and negative lenses of each pair is selected from the group of motions consisting of:
axial displacement of positive and negative cylinder lenses relative to one another so as to focus the plurality of beamlets in a common focal plane on the surface of the thin film,
linear displacement of positive and negative cylinder lenses relative to one another perpendicular to the longitudinal axis and second direction,
rotational displacement of positive and negative cylinder lenses relative to one another about the elongated axis, and
a combination of the axial, linear and rotational displacement.

12. The fiber laser of claim 10, wherein a number of delay glass pairs is incrementally increased beginning with a next to the last lenslet of the array, the next to the last lenslet being associated with a single delay glass pair.

13. The fiber laser system of claim 9, wherein the homogenizer further includes a cylinder lens arrangement configured to recombine the beamlets into the line beam on a surface of the thin film, the line beam being shaped with a high aspect ratio, wherein a 3 to 50µm beam width corresponds to the width of the irradiated film area Ab.

14. The fiber laser system of claim 9 further comprising a second or second and third harmonic generators upstream from the optical beam shaping unit, and at least one second QCW fiber laser, the fiber lasers each being a single mode or multimode QCW fiber laser outputting a train of nanosecond pulses at such a pulse repetition rate (PRR) that the shaped laser beam irradiates each location of the thin film area Af substantially simultaneously, the PRR varying, between 100 MHz and 1 GHz.

15. The fiber laser system of claim 8 further comprising an attenuator, polarization controller and collimator between the fiber laser and beam-shaping unit.

16. The fiber system of any of claim 8, wherein either the stage or beam shaping optics or both are displaceable in the first and second directions.

17. The fiber laser system of claim 8 further comprising at least one second QCW burst fiber laser having an output combinable with an output of the one fiber laser or delivered to the thin film synchronously with the output of the first fiber laser through a designated optical beam shaping unit which is configured analogously to the optical beam shaping unit processing the output of the one fiber laser, wherein the line beam has a desired intensity profile in both first and second directions and is selected from a Gaussian, super Gausian or flat top profiles.

18. The fiber laser system of claim 8, wherein the QCW fiber laser operating in the burst engine outputs a train of long pulses at a burst repetition rate (BRR), the long pulses each being partitioned into a train of short pulses at the PRR which is higher than the BRR.

19. The fiber laser system of claim 8 further comprising an acylindrical objective unit configured to shape an intensity profile of the line beam claim in the first direction into a Gaussian, Super-Guassian or a flat-top intensity profile.

* * * * *